(12) United States Patent
Ankoudinov

(10) Patent No.: US 9,224,876 B2
(45) Date of Patent: Dec. 29, 2015

(54) FAST SWITCHING DIODES AND METHODS OF MANUFACTURING THOSE DIODES

(71) Applicant: Alexei Ankoudinov, Redmond, WA (US)

(72) Inventor: Alexei Ankoudinov, Redmond, WA (US)

(*) Notice: Subject to any disclaimer, the term of this patent is extended or adjusted under 35 U.S.C. 154(b) by 0 days.

(21) Appl. No.: 14/589,792

(22) Filed: Jan. 5, 2015

(65) Prior Publication Data

US 2015/0214386 A1  Jul. 30, 2015

Related U.S. Application Data

(60) Provisional application No. 61/931,122, filed on Jan. 24, 2014.

(51) Int. Cl.
| | | |
|---|---|---|
| H01L 29/861 | (2006.01) | |
| H01L 21/324 | (2006.01) | |
| H01L 29/32 | (2006.01) | |
| H01L 21/265 | (2006.01) | |
| H01L 29/66 | (2006.01) | |
| H01L 29/423 | (2006.01) | |

(52) U.S. Cl.
CPC ............ *H01L 29/861* (2013.01); *H01L 21/265* (2013.01); *H01L 21/324* (2013.01); *H01L 29/32* (2013.01); *H01L 29/423* (2013.01); *H01L 29/66136* (2013.01)

(58) Field of Classification Search
None
See application file for complete search history.

(56) References Cited

U.S. PATENT DOCUMENTS

| | | | |
|---|---|---|---|
| 6,888,211 B2 | 5/2005 | Mauder et al. | |
| 8,912,623 B2* | 12/2014 | Vobecky et al. | 257/477 |
| 2003/0062584 A1* | 4/2003 | Takahashi | 257/458 |
| 2006/0278925 A1* | 12/2006 | Yamaguchi | 257/341 |
| 2010/0311230 A1* | 12/2010 | Fujii | 438/542 |
| 2011/0108941 A1* | 5/2011 | Vobecky et al. | 257/477 |
| 2014/0070379 A1* | 3/2014 | Ishimaru et al. | 257/655 |
| 2014/0374882 A1* | 12/2014 | Siemieniec et al. | 257/618 |
| 2015/0050798 A1* | 2/2015 | Kobayashi et al. | 438/475 |

OTHER PUBLICATIONS

Brammer, R., A. Hallen, and J. Hakansson. "Simulation of Proton-induced Local Lifetime Reduction in 10 KV Diodes." IEEE Trans. Electron Devices IEEE Transactions on Electron Devices 40.11 (1993): 2089-091.*

Siemieniec, R., Lutz, J. "Axial Lifetime Control by Radiation Induced Centers in Fast Recovery Diodes", Proc. ISPC 2002, Prague, 2002, 83-90.*

(Continued)

*Primary Examiner* — Joseph Schoenholtz
(74) *Attorney, Agent, or Firm* — Kolisch Hartwell, P.C.

(57) ABSTRACT

Diodes and methods of manufacturing diodes are disclosed. The diodes may include a cathode assembly having a cathode electrode, a N+ substrate layer on the cathode electrode, a N buffer layer on the N+ substrate layer, and a N– bulk layer on the N buffer layer. The N buffer layer may include crystal damage configured to provide recombination centers for charge carriers. The method may include creating a N buffer layer on a N+ substrate wafer, creating a N– bulk layer on the N buffer layer, and inflicting, to the N buffer layer, crystal damage configured to provide recombination centers for charge carriers. The method may include creating a N buffer layer in a N– bulk wafer, creating a N+ substrate layer in the N– bulk wafer, and inflicting, to the N buffer layer, crystal damage configured to provide recombination centers for charge carriers.

3 Claims, 3 Drawing Sheets

(56) References Cited

OTHER PUBLICATIONS

Barbot, J.f., C. Blanchard, E. Ntsoenzok, and J. Vernois. "Defect Levels in N-silicon after High Energy and High Dose Implantation of Proton." Materials Science and Engineering: B 36.1-3 (1996): 81-84.*

Hazdra, P., J. Vobecky, N. Galster, O. Humbel, and T. Dalibor. "A New Degree of Freedom in Diode Optimization: Arbitrary Axial Lifetime Profiles by Means of Ion Irradiation." 12th International Symposium on Power Semiconductor Devices & ICs. Proceedings (Cat. No. 00CH37094) (2000).*

A. Portst et al., Improvement of the Diode Characteristics Using Emitter-Controlled Principles (EMCON-DIODE), 1997, 4 pages, Proc. ISPSD, 1997, pp. 213-217.

Shang-Hui L. Tu et al., Controlling the Characteristics of the MPS Rectifier by Variation of Area of Schottky Region, 1993, 9 pages, IEEE Transactions on Electron Devices, vol. 40, No. 7, 1993, pp. 1307-1315.

V. Rodov et al., High Injection Regime of super barrier rectifier, 2007, 6 pages, Solid State Electronics, vol. 51 (2007), pp. 714-718.

* cited by examiner

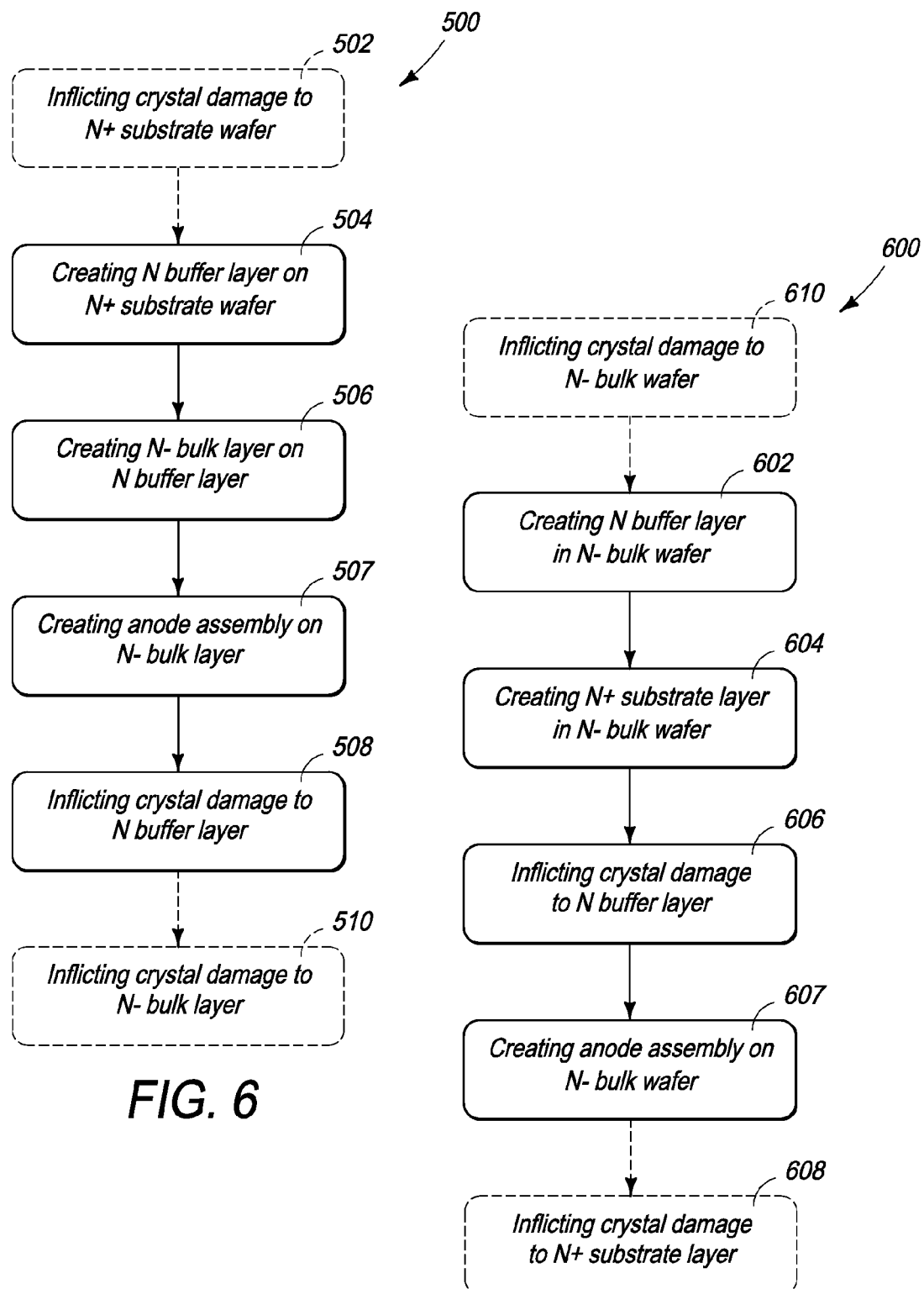

FAST SWITCHING DIODES AND METHODS OF MANUFACTURING THOSE DIODES

CROSS-REFERENCE TO RELATED APPLICATION

This application claims the benefit of U.S. Provisional Patent Application Ser. No. 61/931,122, filed Jan. 24, 2014 and entitled "Diode with limited injection cathode." The complete disclosure of the above provisional application is hereby incorporated by reference for all purposes.

BACKGROUND OF THE DISCLOSURE

Diodes function ideally as "one-way valves" in electronic circuits, allowing current to pass unhindered in one direction and blocking current in the opposite direction. Solid-state diodes are generally constructed from semiconductor crystals with different layers of the crystal having different electrical properties. The most basic semiconductor diode is formed by adjoining two semiconductor crystals: one, called a P-type, that has been doped with atoms so that the majority of charge carriers are mobile positive holes, and the other, called an N-type, that has been doped with atoms so that the majority of charge carriers are negative electrons. This so-called "P-N junction" is connected to the rest of the circuit by attaching an anode material to the P-type semiconductor and a cathode material to the N-type semiconductor.

More complicated diodes are constructed by having one or more layers of N-type semiconductor and/or one or more layers of P-type semiconductor, with different layers having different amounts of mobile charge carriers. In the case of a Schottky diode, the P-type material is omitted entirely with the anode connected directly to the N-type semiconductor. The physical geometry of the diode can also be adjusted, from a simple stack of the various layers to much more complicated arrangements.

An ideal diode serves three distinct functions. First, allow current to flow from the anode side to the cathode side with no drop in potential, and hence no loss of electrical energy. When current is flowing in this direction the diode is said to be in the "forward biased state." Second, completely block all current flowing in the opposite direction regardless of the applied voltage, which is called the "reverse biased voltage." Third, instantaneously switch between the first two behaviors, that is, immediately transition between the forward "on" state of allowing current to flow, and the reverse "off" state of blocking all current. This transition is called "commutation," "recovery," or "reverse recovery."

However, diodes do not function ideally. First, there is usually some small drop in potential when the diode is in the forward biased state. Second, the diode allows a nonzero leakage current to flow in the reverse biased state and this leakage current increases as the reverse biased voltage increases. Further, when the reverse bias voltage reaches a certain breakdown voltage the reverse current increases dramatically. Third, a real diode takes time to switch between the on state and the off state. When conducting, the diode is flooded with electrons and holes moving in opposite directions. In order for the diode to transition to the off state this excess "stored charge" needs to be removed from the diode during what is called the "reverse recovery time."

SUMMARY OF THE DISCLOSURE

Some embodiments provide a diode. In some examples, the diode may include a cathode assembly. The cathode assembly may include a cathode electrode, a N+ substrate layer on the cathode electrode, a N buffer layer on the N+ substrate layer, and a N− bulk layer on the N buffer layer. The N buffer layer may be disposed between the N+ substrate layer and the N− bulk layer, and may include crystal damage configured to provide recombination centers for charge carriers. The diode may additionally include an anode assembly adjacent to the N− bulk layer.

Some embodiments provide a method of manufacturing a diode. In some examples, the method may include creating a N buffer layer on a N+ substrate wafer, creating a N− bulk layer on the N buffer layer, creating an anode assembly on the N− bulk layer, and inflicting, to the N buffer layer, crystal damage configured to provide recombination centers for charge carriers.

In some examples, the method may include creating a N buffer layer in a N− bulk wafer, creating a N+ substrate layer in the N− bulk wafer, inflicting, to the N buffer layer, crystal damage configured to provide recombination centers for charge carriers, and creating an anode assembly on the N− bulk wafer.

BRIEF DESCRIPTION OF THE DRAWINGS

FIG. 6 is a flow chart of an example of a method of manufacturing a diode.

FIG. 7 is a flow chart of another example of a method of manufacturing a diode.

DETAILED DESCRIPTION OF THE DRAWINGS

Figure 1:
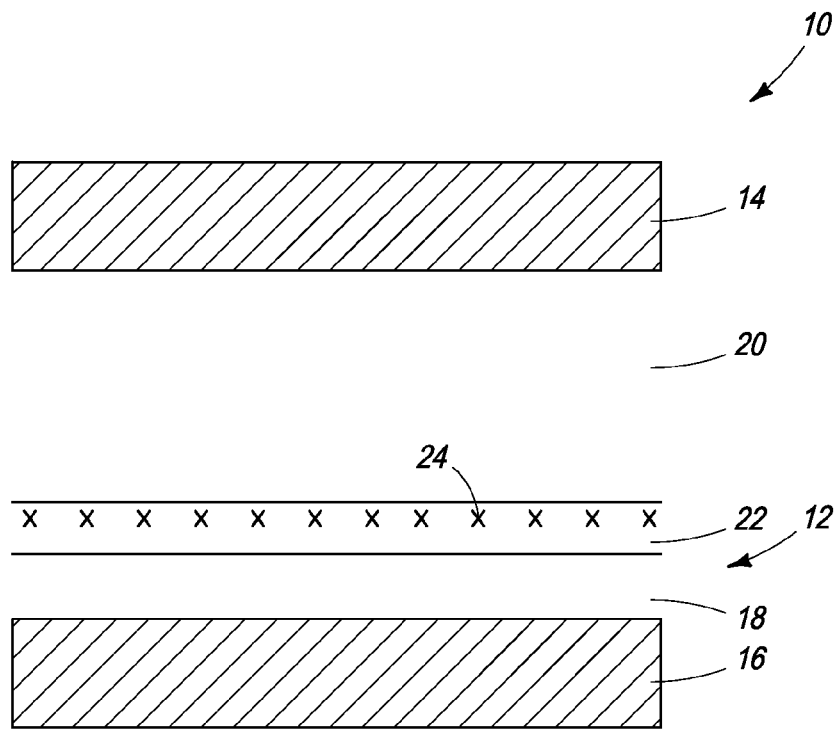
FIG. 1 is a schematic sectional view of an example of a diode.

FIG. 1 is a schematic sectional view of an example of a diode 10. Diode 10 may include any suitable structure configured to provide fast switching times at high applied voltages (such as having reverse recovery times of 200 nanoseconds or less at applied voltages of above 200 volts). For example, diode 10 may include a cathode assembly 12 and an anode assembly 14. The cathode assembly may include a cathode electrode (or cathode electrode layer) 16, a N+ substrate layer 18, a N-bulk layer 20, and a N buffer layer 22.

Cathode electrode 16 may be made of any appropriate metal(s). The cathode electrode may be configured to make ohmic contact with the N+ substrate layer on one side and electrical contact with a circuit on the other.

N+ substrate layer 18 may be on or over (or adjacent to) the cathode electrode. The N+ substrate layer may be a N-type semiconductor, which may be formed from a crystal, such as silicon, silicon carbide, and/or any other appropriate semiconductor(s) doped so that the majority charge carriers are electrons. The "+" after "N" in "N+ substrate layer" indicates that the layer may have a higher concentration of doping atoms than, for example, N− bulk layer 20 and/or N buffer layer 22. In some examples, the concentration of doping atoms may be above $10^{19}$ atoms per cubic centimeter. The N+ substrate layer may make ohmic contact with the cathode electrode layer 16. N+ substrate layer 18 may be configured to allow electrons to pass from the cathode electrode layer into N buffer layer 22 when a forward voltage is applied.

N− bulk layer 20 may be over or on (or adjacent to) N buffer layer 22. The N− bulk layer may be an N-type semiconductor, which may be formed from a crystal, such as silicon, silicon carbide, and/or any other appropriate semiconductor(s) doped so that the majority charge carriers are electrons. The "−" after "N" in "N− bulk layer" indicates that the layer may have a lower concentration of doping atoms than, for example, the N+ substrate layer and/or the N buffer layer. In some examples, the concentration of doping atoms may be between about $3 \times 10^{13}$ and about $6 \times 10^{14}$ atoms per cubic centimeter.

N buffer layer 22 may be over or on (or adjacent to) the N+ substrate layer and/or may be disposed between the N+ substrate layer and the N− bulk layer. The N buffer layer may be a N-type semiconductor, which may be formed from a crystal, such as silicon, silicon carbide, and/or any other appropriate semiconductor(s) doped so that the majority charge carriers are electrons. The lack of "+" or "−" after "N" in "N buffer layer" indicates that the layer may have a higher concentration of doping atoms than, for example, the N− bulk layer and/or may have a lower concentration of doping atoms than, for example the N+ substrate layer. In some examples, N buffer layer 22 may have crystal damage 24 configured to limit injection of charge carriers, such as from the N+ substrate layer into the N− bulk layer.

"Crystal damage," as used in the present disclosure, may include (1) unoccupied lattice points in the crystal where one of the intrinsic semiconductor atoms or one of the dopant atoms is missing from its location in the crystal (e.g., because the atom was dislodged or permanently displaced by an incoming ion); (2) interstitials in the crystal where a dislodged atom or an ion has come to rest in the crystal in a location between adjacent lattice points; (3) where an incoming ion has replaced one of the intrinsic atoms of the semiconductor or one of the dopant atoms in the crystal lattice, and/or (4) other form(s) of crystal damage that changes the physical, chemical, and/or electrical properties of the crystal as compared to corresponding crystal that lacks crystal damage.

The crystal damage in the N buffer layer may limit injection of charge carriers by, for example, providing recombination centers for the electrons. In some examples, N buffer layer 22 may be the only layer in the cathode assembly that includes crystal damage. The concentration of doping atoms may, for example, be between about $3 \times 10^{16}$ and about $3 \times 10^{17}$ atoms per cubic centimeter and/or may be in between the doping levels of the N+ substrate layer and/or the N- bulk layer. In some examples, the thickness of the N buffer layer may be between about 1 and about 20 microns.

Anode assembly 14 may have a variety of configurations and components. Illustrative anode assemblies are described in reference to and shown in FIGS. 3-5. However, anode assembly 14 may include configurations and/or components in addition to, and/or instead of, the anode assemblies shown in FIGS. 3-5. The anode assembly may make ohmic contact with the N− bulk layer 20 on one side and with an electrical circuit on the other side.

Figure 2:
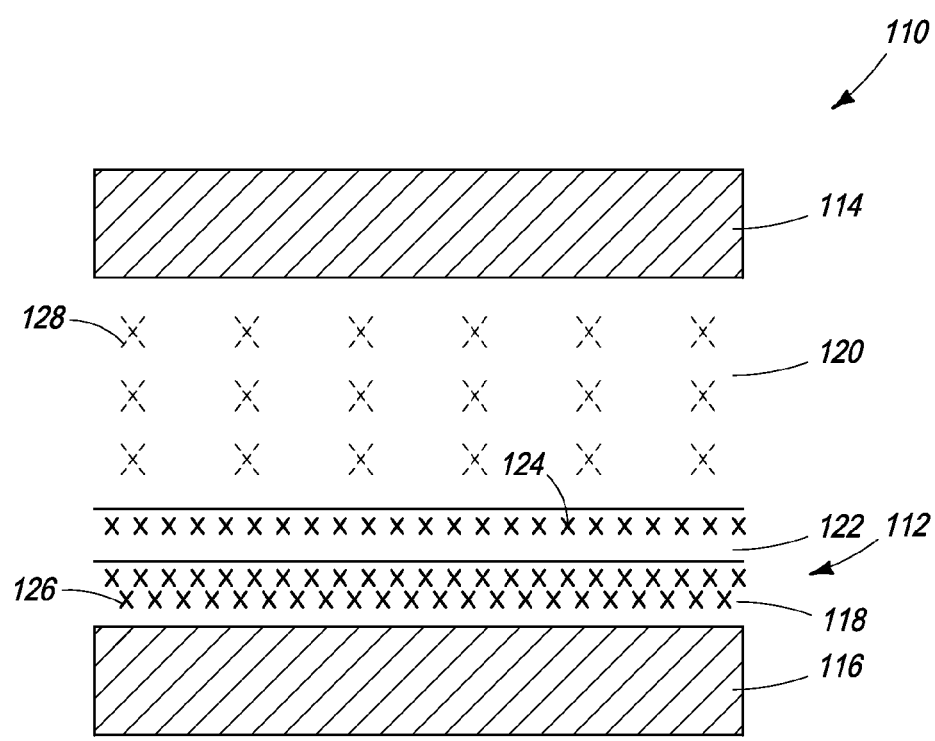
FIG. 2 is a schematic sectional view of another example of the diode of FIG. 1.

FIG. 2 is a schematic sectional view of another example of diode 10, which is generally indicated at 110. The numbered elements of diode 110 may correspond to similarly numbered elements of diode 10 in FIG. 1. Diode 110 may include a cathode assembly 112 and an anode assembly 114. The cathode assembly may include a cathode electrode (or cathode electrode layer) 116, a N+ substrate layer 118, a N-bulk layer 120, and a N buffer layer 122.

In addition to, or instead of, crystal damage 124 indicated in the N buffer layer 122 there may be crystal damage 126 in N+ substrate layer 118. Crystal damage 126 may be configured to limit the injection of charge carriers, such as by providing recombination centers for charge carriers. The levels of crystal damage in layers 118 and 122 need not be the same and the levels of crystal damage in layers 122 and 22 need not be the same. In some examples, the amount or extent of crystal damage 124 required in N buffer layer 122 to control the injection of charge carriers may be less with both layers 118 and 122 including crystal damage than if the crystal damage is present only in N buffer layer 22.

In some examples, N- bulk layer 120 may include crystal damage 128, which may be configured to limit the injection of charge carriers, such as by providing recombination centers for charge carriers. The level of crystal damage in the N− bulk layer generally will be less than the level of crystal damage in the N buffer layer and the N+ substrate layer. In some examples, the level of crystal damage may be measured by the density of recombination centers provided by the crystal damage, as measured in units of recombination centers per unit volume, as compared or relative to the density of recombination centers provided by crystal damage in one or more other layers. The concentration of doping atoms in the layers of diode 110 may be less, more, and/or the same as the concentration of doping atoms in the corresponding layers of diode 10.

The cathode assembly may include any suitable combination of layers with crystal damage configured to limit the injection of charge carriers. For example, in some examples, only the N buffer layer may include the crystal damage. In other examples, only the N− bulk layer and the N buffer layer include the crystal damage. Other combinations are possible and are included in the present disclosure.

Figure 3:
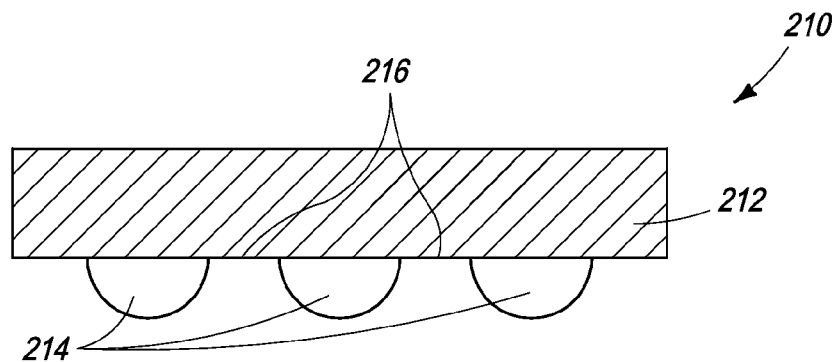
FIG. 3 is a schematic sectional view of an example of an anode assembly of the diode of FIG. 1.

FIG. 3 is a schematic sectional view of an example of anode assembly 14 or 114, which is generally indicated at 210. Anode assembly 210 may sometimes be referred to having a "merged P-N, Schottky (MPS) structure." The anode assembly may be connected to a N− bulk layer, such as N− bulk layer 20 or 120, and may include an anode electrode 212 and P+ regions 214.

Anode electrode 212 may be made of any appropriate metal, and may be configured to alternately make ohmic contact with P+ regions 214 and with the N− bulk layer in Schottky regions 216 on one side and with the anode electrode and electrical contact with a circuit on the other.

P+ regions 214 may be under or on (or adjacent to) the anode electrode. The P+ regions may be composed of a P-type semiconductor, which may be formed from a crystal, such as silicon, silicon carbide, and/or any other appropriate semiconductor(s) doped so that the majority charge carriers are holes. A P-N junction may be formed where the P+ regions contact the N− bulk layer. In some examples, the P+ regions may have a concentration of doping atoms between about $1 \times 10^{18}$ and about $3 \times 10^{18}$ atoms per cubic centimeter. The distance between adjacent P+ regions may, for example, be between about one half and about five microns. The width of the P+ regions may, for example, be about the same as the distance between them. In some examples, the fraction of the surface of anode electrode 212 that is covered by the P+ regions may vary between about 0.3 to about 0.7 of the surface of the anode electrode (e.g., about 30% to about 70% of the anode electrode surface). By varying the fraction of the surface covered by the P+ regions it may be possible to control the injection of charge carriers from the anode.

The N− bulk layer may make contact with anode electrode 212 in Schottky regions 216 and may form a P-N junction with P+ regions 214. Thus, when anode assembly 210 is used in diode 10 or 110, the diode may be a combination of a P-N junction diode and a Schottky diode, which may sometimes be referred to as a "merged P-N Schottky (MPS) diode." MPS diodes may have the advantage of low forward voltage drops and fast switching times because of the Schottky regions and high blocking voltages because of the P-N junction regions. By adding in the N buffer layer with crystal damage to control the injection of charge carriers from the cathode side, the switching time of an MPS diode may be improved. On the anode side, the charge carriers may be injected from only the P+ regions 214 and not the Schottky regions 216, which limits the injection of charge carriers into the N− bulk layer and improves switching time.

Figure 4:
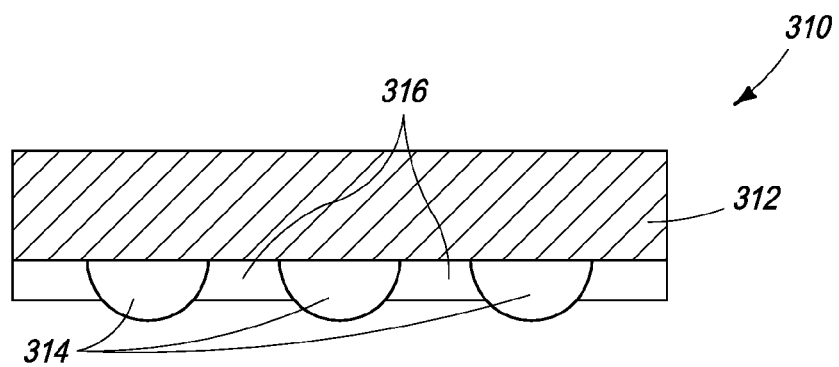
FIG. 4 is a schematic sectional view of another example of an anode assembly of the diode of FIG. 1.

FIG. 4 is a schematic sectional view of another example of anode assembly 14 or 114, which is generally indicated at 310. Anode assembly 310 may sometimes be referred to as having a "modified MPS structure." Anode assembly 310 may be connected to a N− bulk layer, such as N− bulk layer 20 or 120, and may include an anode electrode 312, one or more P+ regions 314, and one or more P regions (or P layer) 316.

The anode electrode 312 and the P+ regions 314 may be the same as the anode electrode 212 and P+ regions 214 of anode assembly 210. P regions 316 may be under or on (or adjacent to) the anode electrode. The P regions may be composed of a P-type semiconductor, which may be formed from a crystal, such as silicon, silicon carbide, and/or any other appropriate semiconductor(s) doped so that the majority charge carriers are holes. In some examples, the concentration of doping atoms in the P regions may be about $1 \times 10^{17}$ atoms per cubic centimeter. As shown in FIG. 4, the P regions may partially fill the space between adjacent P+ regions while still allowing the P+ regions to make contact with N− bulk layers 20 or 120. By controlling the doping levels of the P regions and the P+ regions, the injection of charge carriers into the N− bulk region may be controlled when the diode is in the forward biased state.

Figure 5:
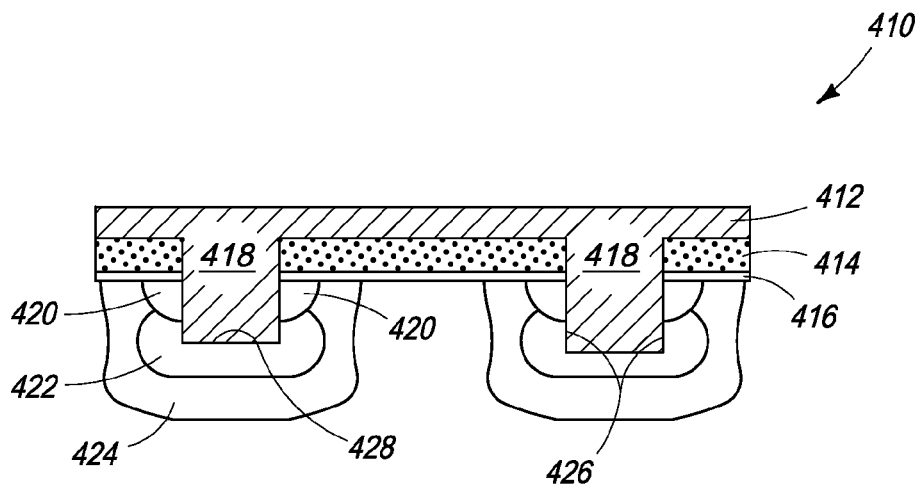
FIG. 5 is a schematic sectional view of a further example of an anode assembly of the diode of FIG. 1.

FIG. 5 is a schematic sectional view of an example of anode assembly 14 or 114, which is generally indicated at 410. Anode assembly 410 may sometimes be referred to as having a "pseudo-Schottky structure." Anode assembly 410 may be connected to a N− bulk layer, such as N− bulk layer 20 or 120.

Anode assembly 410 may include an anode electrode (or anode electrode layer) 412, a gate electrode layer 414, and a gate oxide layer 416. The anode electrode may include one or more trenches 418 that protrude through the gate electrode layer and/or the gate oxide layer. In some examples, anode assembly 410 may include a N+ anode contact 420, a P+ anode contact 422, and/or a P body region 424 for one or more trenches 418 (and in some examples, for each trench 418). N+ anode contacts 420 may make ohmic contact with gate oxide layer 416 and with a vertical side 426 of their associated trench 418, which may partially (but not completely) cover the surface of the trench that protrudes through the gate oxide layer. The P+ anode contact may be disposed under a protruding end 428 of its associated trench, making ohmic contact with the trench and with the N+ anode contact 420. The P body region 424 may be disposed around the N+ and P+ anode contacts and in contact with gate oxide layer 416. Anode assembly 410 may be in contact with a N− bulk layer, such as N− bulk layer 20 or 120. By disposing the P body region around the N+ and P+ anode contacts, the N− bulk layer may make contact with only the P body region and gate oxide layer 416.

Anode electrode 412 may be made of any appropriate metal, and may be configured to make ohmic contact with the N+ and P+ anode contacts along with the gate electrode and gate oxide layers. The anode electrode also may make electrical contact with a circuit (not shown).

Gate electrode layer 414 may be under or on (or adjacent to) anode electrode 412, and may be constructed from a highly doped N-type polysilicon or one or more suitable metals with appropriate work function. In some examples, gate electrode layer 414 may have a thickness of about 600 to about 1200 angstroms.

Gate oxide layer 416 may be under or on (or adjacent to) gate electrode layer 414. The gate oxide layer may be an insulating layer composed of silicon dioxide, silicon oxynitride, and/or any other suitable dielectric material(s). Gate oxide layer 416 may have a thickness of about 30 to about 200 angstroms.

N+ and P+ anode contacts 420 and 422 may have been doped at levels suitable for making ohmic contact with the metal of their associated trench, which may be referred to as a protruding piece of anode electrode 412. For example, the N+ anode contact may be doped at a concentration of more than about $1 \times 10^{19}$ atoms per cubic centimeter and the P+ anode contact at a concentration of more than about $1 \times 10^{18}$ atoms per cubic centimeter. The plus sign refers the relatively high level of doping and the "N" and "P" indicate that the majority charge carriers in the two materials are electrons and holes, respectively. In some examples, trenches 418 may protrude downward through the gate electrode layer, the gate oxide layer, and the N+ anode contacts but not through the P+ anode contacts.

P body region 424 may be composed of a P-type semiconductor, which may be formed from a crystal, such as silicon, silicon carbide, and/or any other appropriate semiconductor(s) doped so that the majority charge carriers are holes. In some examples, P body region 424 may have a concentration of doping atoms that is less than the concentration in the P+ anode contacts but that is still sufficient to prevent a "punch-through" of the electric field.

FIG. 6 shows an example of a method of manufacturing a diode (such as diode 10 or diode 110), which is generally indicated at 500.

At 504, an N buffer layer may be created on a N+ substrate wafer. The N+ substrate wafer may be created via the Czochralski method and/or any suitable method(s). The N buffer layer may, for example, be deposited via epitaxial growth on the N+ substrate layer. Alternatively, the N buffer layer may be created by first epitaxially growing a layer of semiconductor material on the N+ substrate wafer and then implanting the layer of semiconductor material with dopant atoms of the desired concentration.

At 506, a N− bulk layer may be created on the N buffer layer. The N− bulk layer may be deposited via epitaxial growth on the N buffer layer. At 507, an anode assembly may be created on or on top of the N− bulk layer. At 508, crystal damage may be inflicted to the N buffer layer. The crystal damage may be configured to provide recombination centers for charge carriers. The crystal damage may be inflicted by irradiating the N buffer layer with ions. The ions may be helium ions, hydrogen ions, and/or any other ions that can inflict the required crystal damage.

In some examples, method 500 may include step 502. At 502, crystal damage may be inflicted to the N+ substrate wafer. The crystal damage may be configured to provide recombination centers for charge carriers. In some examples, one or more irradiation techniques may be used to create well-localized traps and/or voids. The position and depth of the crystal damage caused may be controlled by varying the irradiation energy and the type of ions used. After the crystal damage is made the surface of the N+ substrate may be annealed. This annealing may be in preparation for an epitaxial growth stage to follow. The crystal damage buried underneath this annealing may remain throughout one or more other steps of method 500. However, if step 502 is not performed, then there may be no need to anneal the surface of the N+ substrate wafer.

If the N+ substrate wafer underwent step 502 and the surface of the N+ substrate wafer was subsequently annealed, the creation of the N buffer layer at 504 may be facilitated by the annealing process. If the N+ substrate layer did not undergo step 502 and the surface of the N+ substrate was subsequently not annealed, then the N buffer layer may be created on the N+ substrate without further treatment of the surface of the N+ substrate.

Additionally, the level of crystal damage inflicted in step 508 may be more than, the same as, or less than the level of crystal damage inflicted in step 502. Further, the level of crystal damage in step 508 may change depending on whether or not step 502 was completed. For example, if step 502 is omitted, the crystal damage inflicted in step 508 may be higher than if step 502 was performed. Crystal damage in both the N+ substrate and N buffer layers may serve to limit the injection of charge carriers into the bulk of the diode. If crystal damage in the N+ substrate is also limiting injection then the crystal damage in the N buffer layer may not need to be as extensive. The surface of the N buffer layer may be annealed in order to prepare for other step(s) in method 500.

In some examples, method 500 may include step 510. At 510, crystal damage may be inflicted to the N− bulk layer. The level of crystal damage in the N− bulk layer generally will be less than the level of crystal damage in the N buffer layer and the N+ substrate layer. The method of inflicting crystal damage in the N− bulk layer may be the same as is used in step 508 and/or in step 502.

Although inflicting crystal damage to one or more layers of the cathode assembly are shown as discrete steps, the crystal damage may be inflicted in any suitable way(s). For example, inflicting crystal damage on a single layer may be performed in multiple steps with one of more of those steps being performed after one or more other steps of method 500 are performed. Alternatively, inflicting crystal damage may be performed on two or more layers on a single step.

Method 500 may further include one or more other steps, such as applying an anode structure to the N− bulk layer and/or a cathode electrode to the N+ substrate layer. Any anode structure may be used, such as any of the anode assemblies described in reference to FIGS. 3-5 may be used to limit the injection of charge carriers into the diode.

The steps of method 500 have been described above in a particular order but it should be understood that the steps may be completed in any suitable order. For example, step 508 of inflicting crystal damage to the N buffer layer may occur prior to step 506 of creating the N− bulk layer on the N buffer layer. Alternatively, step 508 of inflicting crystal damage to the N buffer layer may occur after step 506 of creating the N− bulk layer on the N buffer layer. In this case, the energy of the radiation may need to be controlled to adjust the depth at which crystal damage occurred so that the crystal damage may largely be contained within the N buffer layer. If the radiation used to inflict the crystal damage in the N buffer layer is directed from the anode side of the diode then some crystal damage may necessarily occur in the N− bulk layer as the radiation passed through on its way to the N buffer layer. Thus, in some examples, step 510 may be completed concurrently with step 508. Additionally, inflicting crystal damage to one or more of the layers may be performed before or after the anode assembly is created on the N− bulk layer. Furthermore, although method 500 is shown and described to include particular steps, other examples of method 500 may add, omit, or modify one or more steps.

FIG. 7 is a flow chart showing an example of a method of manufacturing a diode (such as diode 10 or diode 110), which is generally indicated at 600.

At 602, a N buffer layer may be created in a N− bulk wafer. The N− bulk wafer may be created by the float-zone method and/or other suitable method(s). The N buffer layer may, for example, be created by implanting the N− bulk wafer with ions and regulating the temperature of the N− bulk wafer to diffuse those ions. This implantation and diffusion may be responsible for increasing the concentration of doping atoms in the semiconductor. The N buffer layer may then have a higher concentration of doping atoms than the rest of the N− bulk layer. By controlling the energy of the ions during implantation, the depth and thickness of the N buffer layer that is created may be controlled. At 604, an N+ substrate layer may be created in the N− bulk wafer. For example, the N+ substrate layer may be created by implanting the N− bulk wafer with ions and regulating the temperature of the N− bulk wafer to diffuse those ions. As with the creation of the N buffer layer, the concentration of doping atoms in the N+ substrate may be controlled by controlling the parameters of the implantation and diffusion. The depth and thickness of the N+substrate layer may be controlled by controlling the parameters of the implantation and diffusion. In some examples, it is possible to have the N+ substrate layer created on an outer edge of the N− bulk wafer, with the N buffer layer disposed adjacent to the N+ substrate layer within the N− bulk wafer.

At 606, crystal damage may be inflicted to the N buffer layer. The crystal damage may be configured to provide recombination centers for charge carriers. The crystal damage may be inflicted, for example, by irradiating the N buffer layer with ions. The ions may be helium ions, hydrogen ions, and/or any other ions that can inflict the required crystal damage. The level of crystal damage inflicted in step 606 may be more than, the same as, or less than the level of crystal damage inflicted in one or more other steps of method 600, such as step 608.

Furthermore, the level of crystal damage in step 606 may change depending on whether or not step 608 is completed. For example, if step 608 is omitted, the crystal damage inflicted in step 606 may be higher than if step 608 is performed. Crystal damage in both the N+ substrate and N buffer layers may serve to limit the injection of charge carriers into the bulk of the diode. If crystal damage in the N+ substrate is also limiting injection, then the crystal damage in the N buffer layer may not need to be as extensive. The depth at which the crystal damage occurs may be controlled by varying the energy of the irradiating ions, thus allowing the crystal damage to be localized within the N buffer layer. At 607, an anode assembly may be created on or on top of the N− bulk wafer.

In some examples, method 600 may include step 608. At 608, crystal damage may be inflicted to the N+ substrate layer. The crystal damage may be accomplished by the methods described in step 606, though the level of crystal damage in the N+ substrate layer may be more than, the same as, or less than the level of damage in the N buffer layer. As in 606, the depth at which the crystal damage occurs may be controlled by varying the energy of the irradiating ions, thus allowing the crystal damage to be localized within the N+ substrate layer.

In some examples, method 600 may include step 610. At 610, crystal damage may be inflicted to the N− bulk wafer. The level of crystal damage in the N− bulk layer generally will be less than the level of crystal damage in the N buffer layer and the N+ substrate layer. The method of inflicting crystal damage in the N– bulk wafer may be the same as is used in step 606 and/or in step 608.

Although inflicting crystal damage to one or more layers of the cathode assembly are shown as discrete steps, the crystal damage may be inflicted in any suitable way(s). For example, inflicting crystal damage on a single layer may be performed in multiple steps with one of more of those steps being performed after one or more other steps of method 600 are performed. Alternatively, inflicting crystal damage may be performed on two or more layers on a single step.

Method 600 may further include one or more other steps, such as applying an anode structure to the N– bulk layer and/or a cathode electrode to the N+ substrate layer. Any anode structure may be used, such as any of the anode assemblies described in reference to FIGS. 3-5 may be used to limit the injection of charge carriers into the diode.

The steps of method 600 have been discussed above in a particular order but it should be understood that the steps may be completed in any suitable order. For example, step 606 of inflicting crystal damage to the N buffer layer may occur prior to step 604 of creating the N+ substrate layer in the N– bulk wafer. Alternatively, step 606 of inflicting crystal damage to the N buffer layer may occur after step 604 of creating the N+ substrate layer in the N– bulk wafer. In this case, the energy of the radiation may need to be controlled to adjust the depth at which crystal damage occurred so that the crystal damage may largely be contained within the N buffer layer. If the radiation used to inflict the crystal damage in the N buffer layer is directed from the anode side of the diode then some crystal damage may necessarily occur in the N– bulk layer as the radiation passed through on its way to the N buffer layer. Thus, in some examples, step 610 may be completed concurrently with step 606. Step 610 may be completed at any point during method 600, such as before step 602, after step 610, or between steps 602 and 610. Additionally, although method 600 is shown and described to include particular steps, other examples of method 600 may add, omit, or modify one or more steps.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. The subject matter of the inventions includes all novel and nonobvious combinations and subcombinations of the various elements, features, functions, and/or properties disclosed herein. The following claims particularly point out certain combinations and subcombinations regarded as novel and nonobvious. Inventions embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the inventions of the present disclosure.

What is claimed is:

1. A diode, comprising:
    a cathode assembly including:
        a cathode electrode,
        a N+ substrate layer on the cathode electrode,
        a N buffer layer on the N+ substrate layer, and
        a N– bulk layer on the N buffer layer, wherein the N buffer layer is disposed between the N+ substrate layer and the N– bulk layer, and the N buffer layer includes crystal damage configured to provide recombination centers for charge carriers; and
    an anode assembly adjacent to the N– bulk layer, the anode assembly including:
        an anode electrode;
        a gate electrode layer under the anode electrode; and
            a gate oxide layer under the gate electrode layer, wherein the anode electrode includes one or more trenches through the gate electrode and gate oxide layers, wherein at least one trench of the one or more trenches includes a N+ anode contact, a P+ anode contact, and a P body region.

2. The diode of claim 1, wherein the N+ substrate layer includes crystal damage configured to provide recombination centers for charge carriers.

3. The diode of claim 1, wherein the N– bulk layer includes crystal damage configured to provide recombination centers for charge carriers, the density of recombination centers provided by the crystal damage in the N– bulk layer being less than the density of recombination centers provided by the crystal damage in the N buffer layer.

\* \* \* \* \*